(12) United States Patent
Oga et al.

(10) Patent No.: US 9,401,319 B2
(45) Date of Patent: Jul. 26, 2016

(54) SEMICONDUCTOR DEVICE

(75) Inventors: Takuya Oga, Chiyoda-ku (JP);
Kazuyasu Sakamoto, Chiyoda-ku (JP);
Tsuyoshi Sugihara, Chiyoda-ku (JP);
Masaki Kato, Chiyoda-ku (JP); Daisuke Nakashima, Chiyoda-ku (JP); Tsuyoshi Jida, Chiyoda-ku (JP); Gen Tada, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 245 days.

(21) Appl. No.: 13/980,997

(22) PCT Filed: Jun. 9, 2011

(86) PCT No.: PCT/JP2011/063246
§ 371 (c)(1),
(2), (4) Date: Jul. 22, 2013

(87) PCT Pub. No.: WO2012/169044
PCT Pub. Date: Dec. 13, 2012

(65) Prior Publication Data
US 2013/0307130 A1 Nov. 21, 2013

(51) Int. Cl.
*H01L 23/48* (2006.01)
*H01L 23/495* (2006.01)
(Continued)

(52) U.S. Cl.
CPC ........ *H01L 23/4952* (2013.01); *H01L 23/3107* (2013.01); *H01L 23/49524* (2013.01); *H01L 23/49551* (2013.01); *H01L 23/49562* (2013.01); *H01L 23/49575* (2013.01); *H01L 24/29* (2013.01); *H01L 24/37* (2013.01); *H01L 24/40* (2013.01); *H01L 24/73* (2013.01); *H01L 24/97* (2013.01); *H01L 24/05* (2013.01); *H01L 24/06* (2013.01); *H01L 24/30* (2013.01);
(Continued)

(58) Field of Classification Search
CPC .................................................. H01L 23/4952
See application file for complete search history.

(56) References Cited

U.S. PATENT DOCUMENTS 4,935,803 A 6/1990 Kalfus et al.
6,630,726 B1 * 10/2003 Crowley et al. ............... 257/666
(Continued)

FOREIGN PATENT DOCUMENTS

CN 2532582 Y 1/2003
CN 1649146 A 8/2005
(Continued)

OTHER PUBLICATIONS

Communication dated Dec. 5, 2014, issued by the European Patent Office in counterpart Application No. 11867292.2.
(Continued)

*Primary Examiner* — William Harriston
(74) *Attorney, Agent, or Firm* — Sughrue Mion, PLLC

(57) ABSTRACT

A semiconductor device is provided, in which a first lead (11) is joined with the bottom electrode (23) of a MOS-FET (21) with first solder (51), the top electrode (22) of the MOS-FET is joined with an internal lead (31) with second solder (52), the internal lead is joined with a projection (61) of a second lead with third solder (53), and the first lead, second lead, MOS-FET and internal lead are integrally molded using sealing resin (41), wherein the first solder and second solder include support members (54) and (55), respectively, located thereinside and positions of the internal lead and MOS-FET are stabilized by self-alignment.

14 Claims, 7 Drawing Sheets

(51) Int. Cl.
*H01L 23/00* (2006.01)
*H01L 23/31* (2006.01)
*H01L 25/11* (2006.01)

(52) U.S. Cl.
CPC ............... *H01L 24/32* (2013.01); *H01L 24/45* (2013.01); *H01L 24/48* (2013.01); *H01L 24/83* (2013.01); *H01L 24/85* (2013.01); *H01L 24/92* (2013.01); *H01L 25/115* (2013.01); *H01L 2224/04026* (2013.01); *H01L 2224/04034* (2013.01); *H01L 2224/04042* (2013.01); *H01L 2224/05553* (2013.01); *H01L 2224/05567* (2013.01); *H01L 2224/06181* (2013.01); *H01L 2224/29201* (2013.01); *H01L 2224/29347* (2013.01); *H01L 2224/29355* (2013.01); *H01L 2224/30181* (2013.01); *H01L 2224/32245* (2013.01); *H01L 2224/37011* (2013.01); *H01L 2224/40095* (2013.01); *H01L 2224/40179* (2013.01); *H01L 2224/40245* (2013.01); *H01L 2224/40247* (2013.01); *H01L 2224/40249* (2013.01); *H01L 2224/45124* (2013.01); *H01L 2224/48091* (2013.01); *H01L 2224/48247* (2013.01); *H01L 2224/48465* (2013.01); *H01L 2224/48699* (2013.01); *H01L 2224/73215* (2013.01); *H01L 2224/73221* (2013.01); *H01L 2224/73263* (2013.01); *H01L 2224/73265* (2013.01); *H01L 2224/8314* (2013.01); *H01L 2224/83139* (2013.01); *H01L 2224/83143* (2013.01); *H01L 2224/83815* (2013.01); *H01L 2224/84138* (2013.01); *H01L 2224/84143* (2013.01); *H01L 2224/84205* (2013.01); *H01L 2224/85205* (2013.01); *H01L 2224/92157* (2013.01); *H01L 2224/92246* (2013.01); *H01L 2224/97* (2013.01); *H01L 2924/00011* (2013.01); *H01L 2924/00014* (2013.01); *H01L 2924/014* (2013.01); *H01L 2924/01029* (2013.01); *H01L 2924/01082* (2013.01); *H01L 2924/1306* (2013.01); *H01L 2924/13091* (2013.01); *H01L 2924/181* (2013.01); *H01L 2924/1815* (2013.01); *H01L 2924/3511* (2013.01)

(56) References Cited

U.S. PATENT DOCUMENTS

| | | |
|---|---|---|
| RE41,869 E | 10/2010 | Kawashima et al. |
| RE43,663 E | 9/2012 | Kawashima et al. |
| 2005/0161785 A1* | 7/2005 | Kawashima et al. ......... 257/678 |
| 2005/0167802 A1 | 8/2005 | Hirano et al. |
| 2006/0255476 A1* | 11/2006 | Kuhlman et al. ............ 257/782 |
| 2007/0057368 A1 | 3/2007 | Ho et al. |
| 2007/0290336 A1* | 12/2007 | Sun et al. ...................... 257/735 |
| 2008/0087992 A1 | 4/2008 | Shi et al. |
| 2009/0218673 A1 | 9/2009 | Sun et al. |
| 2009/0224383 A1 | 9/2009 | Cruz et al. |
| 2009/0236708 A1 | 9/2009 | Shi et al. |

FOREIGN PATENT DOCUMENTS

| | | |
|---|---|---|
| CN | 101720504 A | 6/2010 |
| CN | 201838572 U | 5/2011 |
| EP | 0362547 A1 | 4/1990 |
| EP | 1725087 A1 | 11/2006 |
| JP | 63170961 U | 11/1988 |
| JP | 2001-298142 A | 10/2001 |
| JP | 2002110750 A | 4/2002 |
| JP | 2003-133497 A | 5/2003 |
| JP | 2005-244166 A | 9/2005 |
| JP | 2006-216736 A | 8/2006 |
| JP | 2006-287064 A | 10/2006 |
| JP | 200950900 A | 3/2009 |
| JP | 2010-171181 A | 8/2010 |

OTHER PUBLICATIONS

Communication dated Mar. 20, 2015 from the European Patent Office in counterpart European Application No. 11867292.2.
Communication dated Sep. 25, 2015, issued by the State Intellectual Property Office of the P.R.C. in corresponding Chinese Application No. 201180070578.9.

* cited by examiner (a)

(b)

(c)

(d)

SEMICONDUCTOR DEVICE

CROSS REFERENCE TO RELATED APPLICATIONS

This is a National Stage of International Application No. PCT/JP2011/063246, filed Jun. 9, 2011, the contents of all of which are incorporated herein by reference in their entirety.

TECHNICAL FIELD

The present invention relates to resin-sealed semiconductor devices for constituting a power inverter circuit using MOS-FET elements.

BACKGROUND ART

With progress in integration of controllers into vehicular rotating machines and miniaturization of onboard devices, semiconductor devices used for those also need reduction in size and weight and high quality.

In addition, onboard power semiconductor devices are also required dealing with high current while being reduced in size.

Therefore, power semiconductor devices using MOS-FET elements have been developed, some of which are configured such that bottom electrodes of the MOS-FET elements are soldered onto an insulation wiring substrate and their top electrodes are joined to the wiring substrate by wire bonding and then the elements are housed in a resin casing, and others are configured in such a way that the bottom electrodes of the MOS-FET elements are soldered to a metal lead frame, their top electrodes are further joined with the metal lead frame by soldering internal leads, and then those elements are resin-sealed by transfer-molding.

For example Patent documents 1 and 2 have put forward proposals on conventional semiconductor devices in which the top electrodes of MOS-FET elements are joined with a lead frame with internal leads. (See Patent documents 1, 2.)

PRIOR ART DOCUMENT

Patent Document

Patent document 1: Japanese Laid-Open Patent Publication No. 2006-216736
Patent document 2: Japanese Laid-open Patent Publication No. 2001-298142

DISCLOSURE OF THE INVENTION

Problem to be Solved by the Invention

If reduction in size is further intended in a configuration, such as the conventional example, in which the top electrode of a semiconductor chip is joined with lead frame with an internal lead, there arises a problem of how to mount the semiconductor chip and internal lead in the soldering process with their positions and attitudes stably controlled.

In Patent document 1 (FIG. 1), for example, since the joint surface of the internal lead (frame) is formed so small as to come inside the electrode surface of the semiconductor chip, the positions of the electrode and internal lead are deemed to be determined by self-alignment and retained.

However, there is no means for aligning the lead frame (second lead terminal) and internal lead in this example; therefore it is concerned that the mounting position of the internal lead would fluctuate and the lead frame and internal lead would be displaced from each other when the internal lead moves in soldering.

In order to miniaturize the semiconductor device, the lead frame needs to be narrowed. When displacement of the internal lead is expected, the joint surface area of the lead frame needs to be widened in order to secure the joint while tolerating the displacement which will make it difficult to miniaturize the semiconductor device.

In addition, there is no means for restricting the thickness of molten solder in this example, so it is concerned that when the semiconductor chip and internal lead move in the self-alignment, the solder thickness varies and the solder is unevenly distributed, and as a result, the semiconductor chip and internal lead become inclined.

If the semiconductor chip and internal lead are inclined, extruded solder will flow out, thereby causing a short-circuit between the top and bottom electrodes, and the thickness of the solder becomes non-uniform, which will cause a problem in that reliability of the solder joint is deteriorated under a temperature cycling environment.

In addition, another problem has been that when a MOS-FET element is used for the semiconductor chip in the configuration of this example, if the MOS-FET element is inclined after soldering, wire bonding to the gate electrode will be unstable.

Moreover in Patent document 2 (FIG. 1), a projection is provided on either one of the lead frame and internal lead at their connection point, a hollow is provided on the other, and the lead frame and internal lead are positioned by engaging those with each other; however, there is no means for positioning the semiconductor pellet and internal lead, which will cause a concern in that the position of their joint fluctuates due to fluctuation of mounting positions of the semiconductor pellet and internal lead and due to solder flow when the solder is molten.

There is no means for restricting the thickness of molten solder also in this example, so it is concerned that if the semiconductor pellet and internal lead are displaced, load balance will be lost and the semiconductor pellet and internal lead become inclined when the solder is molten.

If the semiconductor pellet and internal lead become inclined, extruded solder will flow out, thereby causing a short-circuit between the top and bottom electrodes, and the thickness of the solder becomes non-uniform, which would cause a problem in that reliability of the solder joint, is deteriorated in a temperature cycling environment.

Furthermore, the projection and hollow provided at the connection point between the lead frame and internal lead are set to be engaged with each other in this example; however, it is also concerned that if the mounting position of the internal lead fluctuates, they will not be properly engaged with each other, so that they are joined in a state of being displaced and inclined.

Furthermore, when a MOS-FET element is used for the semiconductor pellet in the configuration of this example, if the MOS-FET element is inclined after soldering, wire bonding to the gate electrode will be unstable.

This invention has been made to solve the foregoing problems, and aims at proposing a configuration, in a semiconductor device in which a MOS-FET element is electrically connected to a lead frame with an internal lead, which enables the lead frame and internal lead and the internal lead and MOS-FET element to be stably positioned and joined with each other, even when the lead frame and internal lead are reduced in size, so as to miniaturize and thin the semiconductor device.

Furthermore, the invention aims at miniaturizing a rotating machine with a built-in inverter circuit using the foregoing miniaturized semiconductor devices.

Means for Solving the Problem

A semiconductor device according to the present invention includes: a first lead; a second lead provided with a protrusion by transforming part of the second lead; a MOS-FET element whose bottom electrode is electrically connected to the first lead; an internal lead for conducting current between the top electrode of the MOS-FET element and second lead; solder material for electrically connecting those with each other and sealing resin for determining their relative positions; wherein the bottom surfaces of the first lead and second lead are in the same plane, the joint surfaces between the internal lead and MOS-FET element and between the internal lead and second lead are also in the same plane, the first lead is joined with the bottom electrode of the MOS-FET element with first solder, the top electrode of the MOS-FET element is joined with the internal lead with second solder, the internal lead is joined with the projection of the second lead with third solder, and the first lead, second lead, MOS-FET element and internal lead are integrally molded using the sealing resin; the semiconductor device comprises support members each located inside at least the first solder and second solder.

Advantage of the Invention

According to the semiconductor device of the present invention, when the internal lead and MOS-FET element move by the self-alignment, the internal lead and MOS-FET element are held horizontally, and the self-alignment can be certainly achieved, so that the first lead, second lead and internal lead can be designed in a minimum necessary size, thereby enabling the semiconductor device to be miniaturized.

In addition, since the self-alignment can be achieved, there is no need for not only a high precision mounter but also a means for retaining positions of the internal lead and MOS-FET element when solder is molten, so that the manufacturing process can be simplified.

Moreover since the thickness of the solder becomes stable, short-circuits due to solder flow can be prevented from occurring between the top and bottom electrodes and between the top and gate electrodes of the MOS-FET element.

The foregoing or other objects, features, aspects and advantages of the present invention will become more apparent from the detailed description of the following embodiments and the accompanying drawings.

BEST MODE FOR CARRYING OUT THE INVENTION

Figure 1:
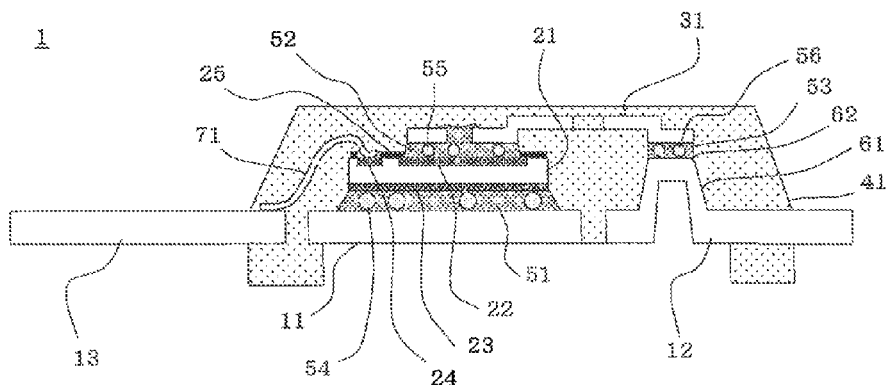
FIG. 1 is a cross-sectional view showing a semiconductor device according to Embodiment 1 of the present invention.

Hereinafter, the embodiments of the present invention will be explained referring to the accompanying drawings. Incidentally the same reference numerals in each drawing represent the same or corresponding parts.

Embodiment 1

Embodiment 1 of the present invention will be explained hereinafter based on the drawings.

Figure 2:
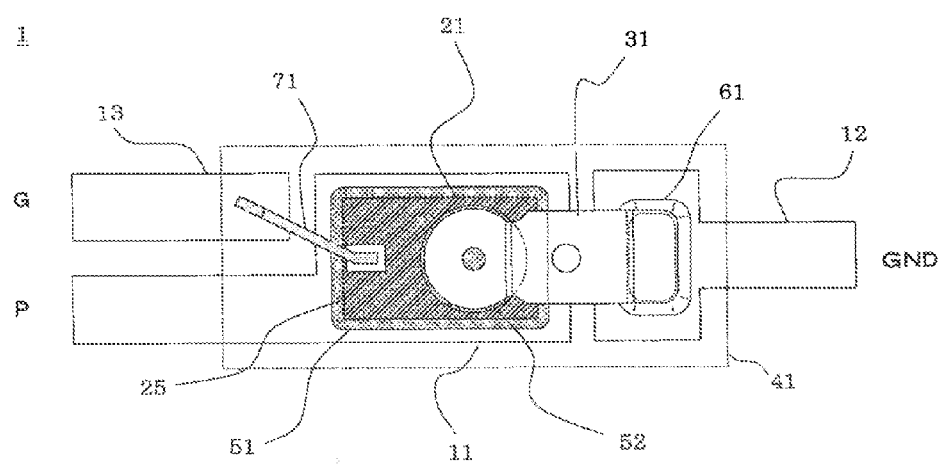
FIG. 2 is a plan view showing the semiconductor device according to Embodiment 1 of the present invention.
Figure 3:
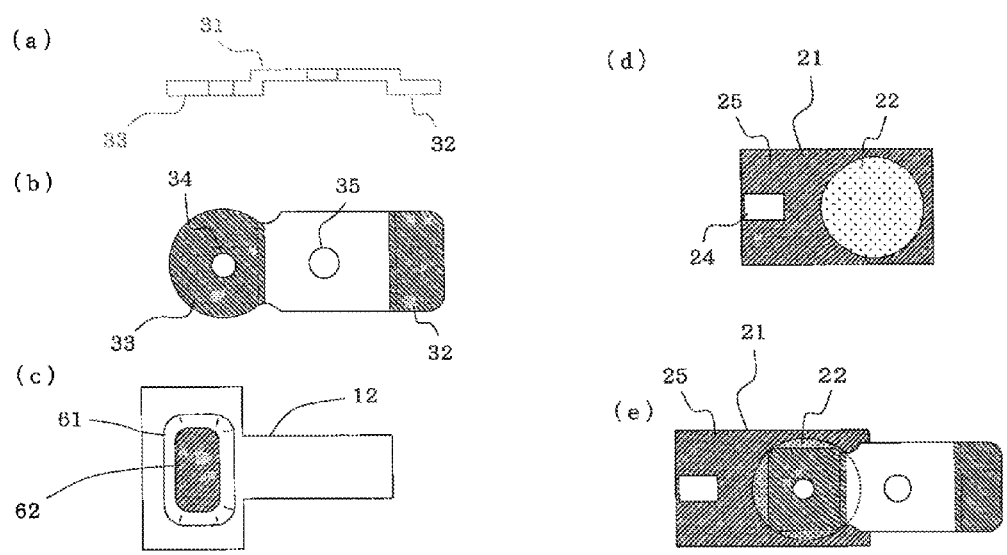
FIG. 3 is a view showing an internal lead and MOS-FET element according to Embodiment 1 of the present invention.

FIG. 1 is a view showing a cross-sectional structure of a semiconductor device according to Embodiment 1 of the present invention; FIG. 2 is a view showing a planar structure of the semiconductor device according to Embodiment 1 of the invention; FIG. 3 is a view showing an internal lead and MOS-FET element according to Embodiment 1.

In the semiconductor device 1 according to Embodiment 1 in FIG. 1 to FIG. 3, the MOS-FET element 21 is mounted on a first lead 11, and the bottom electrode 23 of MOS-FET element 21 is joined with the first lead 11 via first solder 51.

One end of an internal lead 31 is joined with the top electrode 22 of the MOS-FET element 21 via second solder 52; the other end thereof is joined with a projection 61 of a second lead 12 via third solder 53. The projection 61 of the second lead 12 is formed with part the second lead 12 transformed by dowel-forming.

Here, the bottom surface of the first lead 11 and that of the second lead 12 are on the same plane, onto which a not-shown heat sink is attached via not-shown heat-dissipating grease or heat-dissipating adhesive.

In addition, first support member 54, second support member 55 and third support member 56 are located inside the first solder, second solder 52 and third solder 53, respectively.

The support members 54 to 56 are spherical members made of a metal that has good solderability but does not melt at the solder melting temperature, which are, for example, spherical Ni-particles, Cu-particles and the like.

A gate electrode 24 and gate lead 13 are electrically connected with each other by aluminum wire 71.

These first lead 11, second lead 12, solder 51 to solder 53, MOS-FET element 21, internal lead 31, aluminum wire 71 and gate lead 13 are molded and fixed using sealing resin 41. However, part the first lead 11, that of the second lead 12 and that of the gate lead 13 are exposed outside the sealing resin 41, so they can be electrically connected to the exterior.

Incidentally, the back of the first lead 11 surface to which the MOS-FET element 21 is joined and the back of the second lead 12 surface to which the internal lead 31 is joined, which are heat-radiating surfaces, are configured as exposed from the sealing resin 41; however those are not limited to this configuration but may be covered with, for example, the sealing resin 41 or with not-shown heat-conductive insulation material.

Next, the internal lead 31, projection 61 of the second lead 12 and MOS-FET element 21 will be explained.

FIG. 3(*a*) shows a side view of the internal lead 31; FIG. 3(*b*) shows a plan view viewed from the joint surface. The internal lead 31 is provided with a first joint plane 32 and second joint plane 33 by bending, and the first joint plane 32 and second joint plane 33 are in the same plane.

In addition, a through hole 34 is made in the second joint plane 33, and a through hole 35 in a non-joint plane.

Moreover, a joint surface 62 is formed on the top of the projection 61 provided on the part of the second lead 12 as shown in FIG. 3(*c*), and the first joint plane 32 of the internal lead 31 is shaped nearly the same as the joint surface 62 as shown in FIG. 1 and FIG. 2.

Furthermore, on the surface of the MOS-FET element 21 are provided the top electrode 22 and gate electrode 24 as shown in FIG. 3(*d*), and a protective coating 25 is also provided there.

An opening of the protective coating 25 is circular-shaped, and the second joint plane 33 of the internal lead 31 is shaped to be inscribed in the opening of the electrode coating on the top electrode 22 of the MOS-FET element 21 as shown in FIG. 1 and FIG. 2.

Incidentally, the second joint plane 33 of the internal lead 31 in FIG. 3(*b*) is shaped in a near circle, but the plane is not limited to this but may be shaped in a rectangle as shown in FIG. 3(*e*) or in not-shown shapes other than that, such as a polygon, ellipse and oblong. An effect of correcting positions by the self-alignment can be produced, as long as its outline is inscribed in the outline of the top electrode 22 of the MOS-FET element 21 at least three locations.

Figure 4:
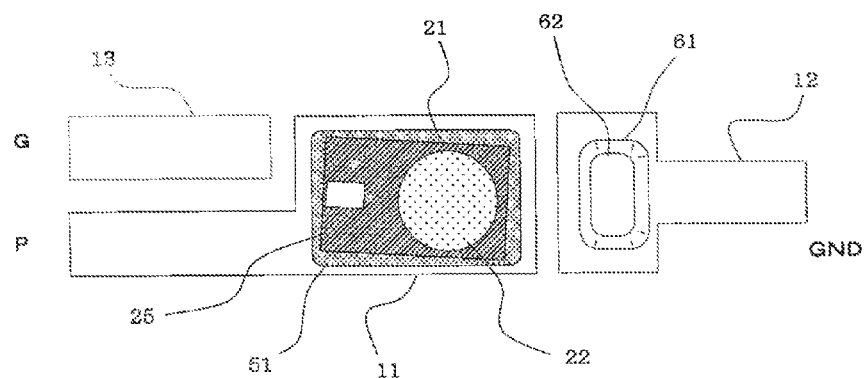
FIG. 4 is a view for explaining a soldering process for the semiconductor device according to Embodiment 1 of the present invention.
Figure 4:
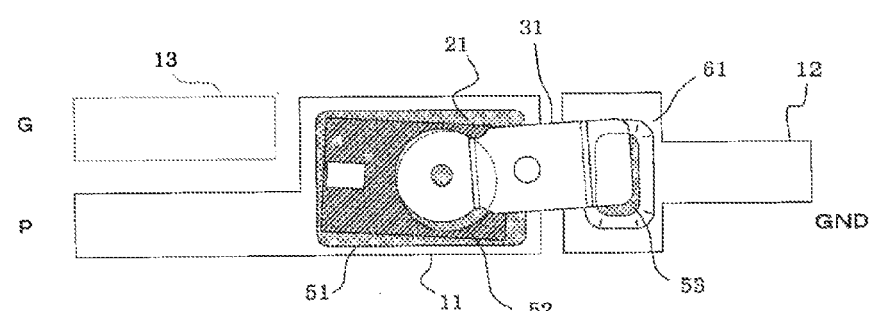
Figure 4:
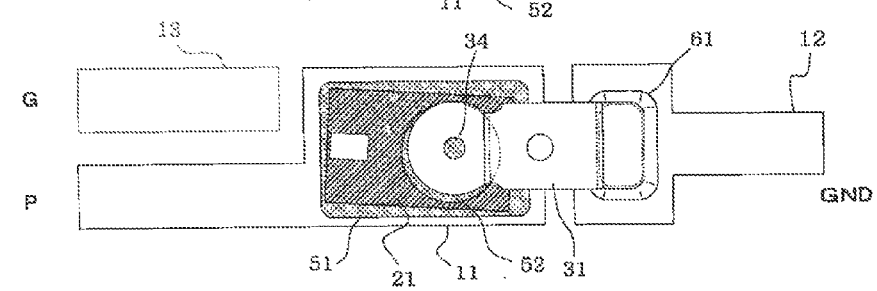
Figure 4:
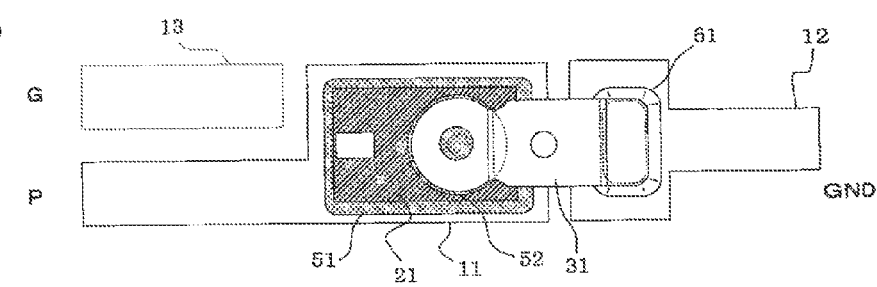

FIG. 4 is a view for explaining a soldering process for the semiconductor device according to Embodiment 1.

FIG. 4(*a*) shows a state of the MOS-FET element 21 being soldered to the first lead 11. At this moment, the MOS-FET element 21 is Sometimes displaced from the target position due to variations in mounting position by a mounter.

FIG. 4(*b*) shows a state in which solder paste is applied to the top electrode 22 of the MOS-FET element 21 and projection 61 of the second lead 12 and on which the internal lead 31 is mounted.

The solder paste is mixed with the support members, and the same solder paste is used for both the second solder 52 and third solder 53, which is fed in the same process.

At this moment, the internal lead 31 is sometimes displaced from the target position due to variations in mounting position by the mounter. In addition, the amount of feeding the solder paste sometimes fluctuates.

Next, when the solder paste is molten in a reflow process, firstly the internal lead 31 moves by the self-alignment due to the surface tension of the third solder 53 so that the top joint surface 62 of the projection 61 of the second lead coincides with the first joint plane 32 of the internal lead 31, as shown in FIG. 4(*c*).

If the third solder 53 is excessive at this moment, the solder spills out to sides of the projection 61; however the outline of the solder on the joint surface 62 of the projection does not change, so that the self-alignment position is retained.

Furthermore, the first solder 51 located on the bottom surface of the MOS-FET element 21 is also remolten, so the MOS-FET element 21 moves by the self-alignment due to the surface tension of the second solder 52 so that the second joint plane 33 of the internal lead 31 comes to the position to be inscribed in the outline of the top electrode 22 of the MOS-FET element 21. If the second solder 52 is excessive at this moment, the solder moves to the top surface of the internal lead 31 through the through hole 34, so that the amount of solder at the joint portion is regulated.

In the foregoing self-alignment, since the first solder 51, second solder 52 and third solder 53 include the first support member 54, second support member 55 and third support member 56, respectively, the internal lead 31 and MOS-FET element 21 can move smoothly, and in addition, they are held horizontally even after the movement.

Then, the gate electrode 24 is connected with the gate lead 13 by the aluminum wire 71 in a not-shown process. Since the MOS-FET element has been joined without inclining, the aluminum wire can be stably joined. Following that, these parts are molded using the sealing resin 41, to become a complete semiconductor device.

Incidentally, the solder paste mixed with metal particles is fed in this example; however the support members and method of feeding solder paste are not limited to this, but, for example, plate solder including a support member is cut out in a necessary shape and then mounted.

Figure 5:
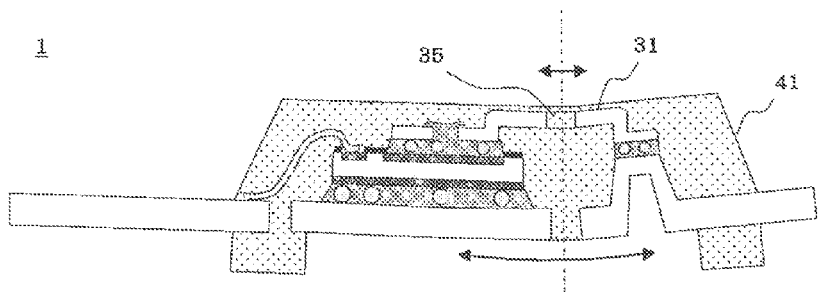
FIG. 5 is a view for explaining deformation due to temperature variations of a thinned semiconductor device.

A thinned semiconductor device deforms as shown in FIG. 5, if the ambient temperature changes, due to difference in linear expansion coefficient between the sealing resin and lead frame. However, even in a state as described above, since the through hole 35 is made in the non-joint portion of the internal lead 31 and this through hole 35 is also filled with the sealing resin 41 in the semiconductor device according to Embodiment 1, the sealing resin 41 can be prevented from being displaced with respect to the internal lead 31 or separated from the lead, so that the solder and MOS-FET element can be prevented from cracking.

As described above, in the semiconductor device 1 according to Embodiment 1 of the present invention, the support member is located inside the first solder and second solder, whereby the first solder and second solder melt at the same time in joining the internal lead. When the internal lead and MOS-FET element move by the self-alignment, the internal lead and MOS-FET element are held horizontally by the support members and the self-alignment can be certainly achieved. Therefore, the first lead second lead and internal lead can be designed in a minimum necessary size, so that the semiconductor device can be miniaturized.

In addition, since the self-alignment can be achieved, not only a high precision mounter but also a means for retaining the positions of the internal lead and MOS-FET element when the solder is molten is not required, so that the manufacturing process can be simplified.

Moreover, since the thickness of the solder becomes stable, short-circuits due to solder flow, between the top and bottom electrodes and between the top and gate electrodes of the MOS-FET element can be prevented.

Furthermore, the first joint plane of the internal lead and top surface of the projection of the second lead are shaped nearly the same, whereby the position of the internal lead is corrected with reference to the second lead, by the self-alignment effect due to the surface extension of the solder.

Furthermore, the second joint plane of the internal lead is shaped to be nearly inscribed in the outline of the opening of the top electrode of the MOS-FET element, whereby the positions of the internal lead and MOS-FET element are corrected by the self-alignment due to the surface tension of the second solder.

At this moment, the internal lead has been already positioned with reference to the second lead; therefore the MOS-FET element moves so as to fit to the position of the internal lead, so that positions of the second lead, internal lead and MOS-FET element can be corrected.

Furthermore, the opening of the top electrode of the MOS-FET element is circular-shaped, whereby even if there is any angular difference between the MOS-FET element and internal lead in a horizontal plane, the self-alignment is smoothly achieved. In addition, even when the MOS-FET element and internal lead are designed to be positioned with an angle formed therebetween, an internal lead that is bilaterally symmetry with respect to the longitudinal direction can be used, so that balance of internal lead can be maintained.

Furthermore, since spherical metal particles are used for the support members, the support members easily roll, which enables the internal lead and MOS-FET element to smoothly move by the self-alignment when the solder is molten.

Furthermore, since their contacting surfaces with the MOS-FET element are spherical, cracking of the MOS-FET element originating from the support members can be prevented.

Furthermore, by including the support member also located inside the third solder, the second solder and third solder can use the same solder paste mixed with spherical metal particles, whereby the solder can be fed in the same process, so that manufacturing process can be simplified.

Furthermore, a through hole is made in the joint plane of the second lead corresponding to the joint portion of the top electrode of the MOS-FET element, whereby solder that becomes excessive when the positions of the internal lead and MOS-FET element are changed by the self-alignment or excessive solder due to fluctuation of feeding the solder can be spilt through the through hole over the upper side of the second joint plane of the internal lead, so that short-circuits can be prevented from occurring between the top and bottom electrodes and between the top and gate electrodes of the MOS-FET element, due to solder flowing to the MOS-FET element surface.

Furthermore, a through hole is made in the non-joint portion of the internal lead, whereby adhesion between the internal lead and sealing resin is enhanced; therefore even when the thickness of the sealing resin is reduced, the internal lead and sealing resin are prevented from separating from each other even if the semiconductor device is deformed with changes in temperature, and stress to the solder and MOS-FET element can be reduced in the thermal deformation.

Embodiment 2

Embodiment 2 of the present invention will be explained based on the drawings.

Figure 6:
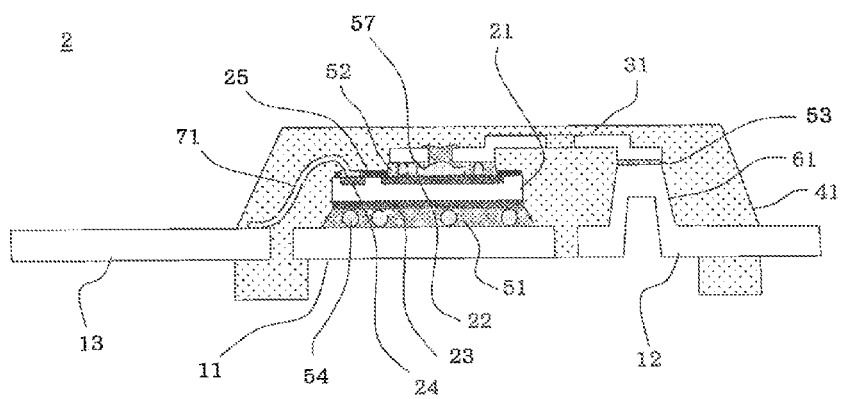
FIG. 6 is a cross-sectional view showing a semiconductor device according to Embodiment 2 of the present invention.
Figure 7:
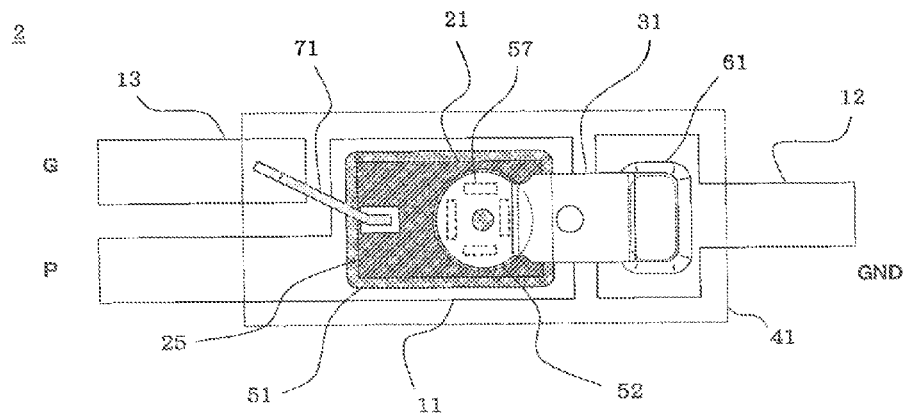
FIG. 7 is a plan view showing the semiconductor device according to Embodiment 2 of the invention.
Figure 8:
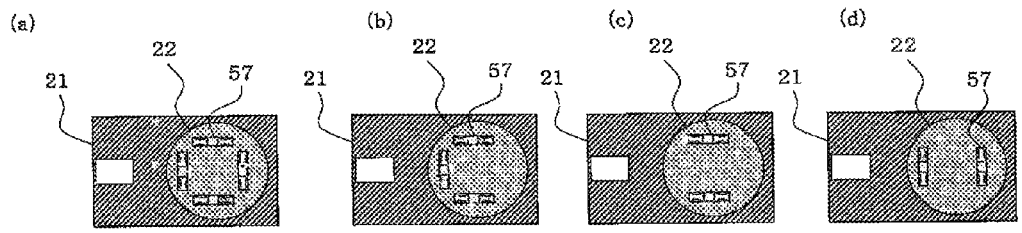
FIG. 8 is a view showing a MOS-FET element according to Embodiment 2 of the present invention.

FIG. 6 is a view showing a cross-sectional structure of a semiconductor device according to Embodiment 2; FIG. 7 is a view showing a planar structure of the device according to Embodiment 2; FIG. 8 is a view showing a MOS-FET element according to Embodiment 2.

As shown in FIG. 6 and FIG. 7, the semiconductor device 2 according to this Embodiment 2 is structured the same as Embodiment 1, except that the support member inside the second solder is replaced with a support member 57 that is formed by ultrasonic-bonding of metal wire, and no support member is provided inside the third solder 53.

As shown in FIG. 8, pieces of metal wire 57 are ultrasonic-bonded to the top electrode 22 of the MOS-FET element 21 at multiple locations, thereby forming the support member.

In addition, the height of the joint plane of the projection 61 of the second lead is set so that the internal lead 31 joined thereto is held horizontally without the support member 56.

The same as Embodiment 1, the positions of the internal lead 31 and MOS-FET element 21 are corrected with reference to the projection 61 provided on the second lead 12, by the self-alignment in the soldering process. Even when the internal lead 31 and MOS-FET element 21 move at this moment, the internal lead 31 and MOS-FET element 21 are held horizontally thanks to the presence of the support members 54 and 57. In addition, since the support member 57 is metal wire ultrasonic-bonded to the top electrode 22 of the MOS-FET element 21, the metal wire is not displaced even when the internal lead 31 moves, so that the internal lead 31 is held horizontally.

Material for the metal wire, which is the support member 57, is, for example, aluminum wire. When aluminum, which is softer than Ni and Cu, is used as the material for the metal wire, even if the MOS-FET element 21 is pressed to the aluminum wire by thermal stress, the MOS-FET element can be prevented from cracking originating from contact points with the aluminum wire.

As described above, in the semiconductor device 2 according to Embodiment 2 of the present invention, the support member located inside the second solder is replaced with one that is formed by ultrasonic-bonding of the metal wire onto the top electrode of the MOS-FET element, whereby the support member is positionally fixed even when the MOS-FET element moves by the self-alignment, with respect to the internal lead; therefore the internal lead can be held horizontally.

Embodiment 3

Embodiment 3 of the present invention will be explained based on the drawings.

Figure 9:
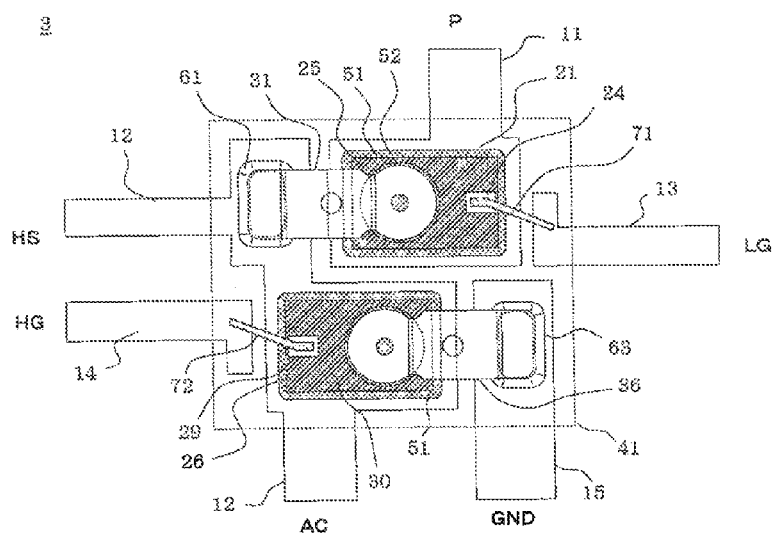
FIG. 9 is a plan view showing a semiconductor device according to Embodiment 3 of the present invention.
Figure 10:
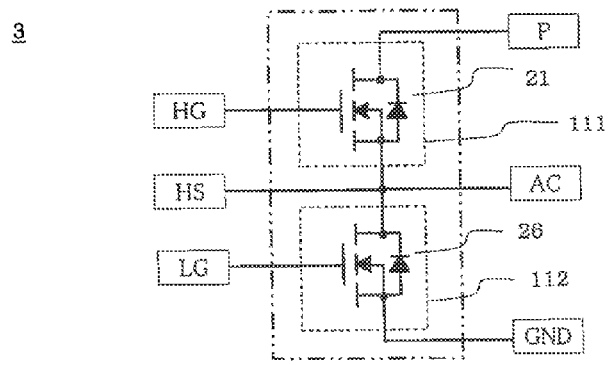
FIG. 10 is a circuit diagram of the semiconductor device according to Embodiment 3 of the present invention.

FIG. 9 is a view showing a planar structure of a semiconductor device according to Embodiment 3 of the present invention; FIG. 10 is a circuit diagram of the semiconductor device according to Embodiment 3.

In FIG. 9, a first MOS-FET element 21 is mounted on the first lead 11, and the bottom electrode 23 of the first MOS-FET element 21 is joined with the first lead 11 via the first solder 51.

The top electrode 22 of the first MOS-FET element 21 is joined with one end of the internal lead 31 via the second solder 52; the other end of the internal lead 31 is joined with the projection 61 provided on the second lead 12 via the third solder 53.

Here, the projection 61 is formed by dowel-forming part of the second lead 12, and the top surface of which is shaped nearly the same as the first joint plane 32 of the internal lead 31.

In addition, an opening is formed in a circular shape by the protective coating 25 on the top electrode 22 of the first MOS-FET element 21, and the outline of the second joint plane 33 of the internal lead 31 is shaped to be inscribed in the opening. The gate electrode 24 and gate lead 13 are electrically connected with each other by the aluminum wire 71.

Moreover, on the second lead 12 is mounted a second MOS-FET element 26, and the bottom electrode of which is joined with the second lead 12 via the first solder 51. One end of a second internal lead 36 is joined with the top electrode of the second MOS-FET element 26 via the second solder 52; the other end of the second internal lead 36 is joined with a projection 63 provided on a third lead 15 via the third solder 53.

Here, the projection 63 is formed by dowel-forming part of the third lead 15, and the top surface of which is shaped nearly the same as the first joint plane of the second internal lead 36.

Furthermore, an opening is formed in a circular shape by a protective coating 30 on the top electrode of the second MOS-FET element 26, and the outline of the second joint plane of the internal lead 36 is shaped to be inscribed in the opening.

A gate electrode 29 and a gate lead 14 are electrically connected by aluminum wire 72.

These first to third leads 11, 12 and 15, first to third solder 51 to 53, MOS-FET elements 21 and 26, internal leads 31 and 36, aluminum wire 71 and 72 and gate leads 13 and 14 are integrally molded and fixed using the sealing resin 41.

However, part of the first to third leads 11, 12 and 15 each and part of gate leads 13 and 14 each are exposed outside the sealing resin 41, so these parts can be electrically connected to the exterior. Thereby, the semiconductor device is constituted with an upper arm and a lower arm of an inverter circuit integrated together. The circuit diagram of the semiconductor device with the integrated upper and lower arms is shown in FIG. 10.

Also in FIG. 9, the first support member, second support member and third support member are located inside the first solder 51, second solder 52 and third solder 53, respectively, the same as those explained in Embodiment 1 and Embodiment 2.

In a soldering process for the semiconductor device 3 according to Embodiment 3 shown in FIG. 9, after the two MOS-FET elements are mounted, solder is fed to the top electrodes of the two MOS-FET elements and also to the surfaces of the two projections and the two internal leads are mounted thereon in the same process; the solder is then molten by a reflow process.

By doing in this way, even if the semiconductor device includes two sets of an internal lead and MOS-FET element, positions of each internal lead and MOS-FET element can corrected by the self-alignment as explained in Embodiment 1.

In FIG. 9 and FIG. 10, an assembly of the first MOS-FET element 21 and first internal lead 31 constituting an upper arm 111 and another assembly of the second MOS-FET element 26 and second internal lead 36 constituting a lower arm 112 are arranged opposite to each other.

By arranging in this way, the distance between the upper arm 111 and lower arm 112 can be shortened, so that the semiconductor device including a pair of upper and lower arms can be miniaturized.

As described above, according to Embodiment 3 of the present invention, wiring outside a semiconductor device can be eliminated in electric equipment using a plurality of semiconductor elements, so that the equipment can be miniaturized.

Embodiment 4

Figure 11:
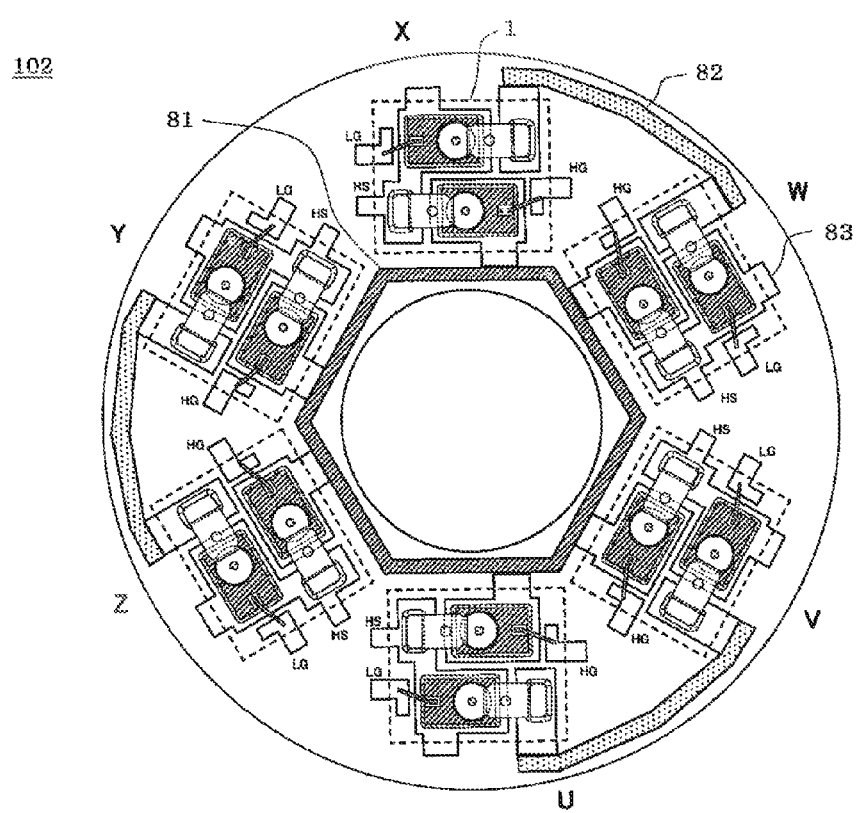
FIG. 11 is a view showing an inverter according to Embodiment 4 using the semiconductor device of the present invention.
Figure 12:
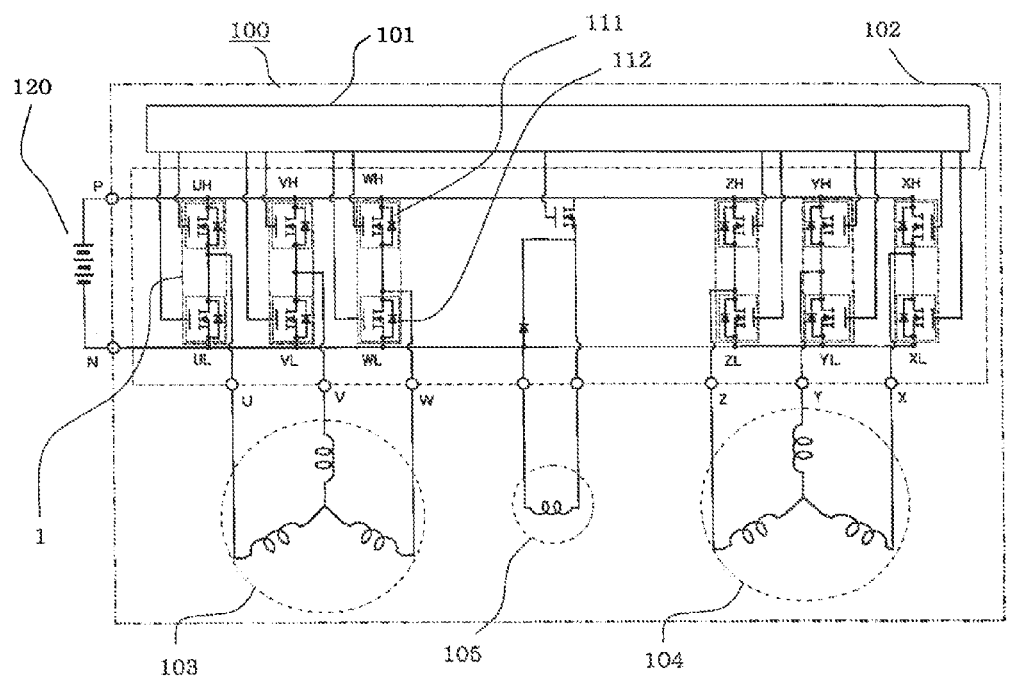
FIG. 12 is an electric circuit diagram of a rotating machine using the inverter in FIG. 11.

FIG. 11 is a plan view showing an inverter 102 according to Embodiment 4 of the present invention; FIG. 12 is an electric circuit diagram of a rotating machine 100 using the inverter in FIG. 11.

In FIG. 11, the positive terminal and negative terminal of the semiconductor device 1 are arranged to protrude outwardly from opposing sides of a near rectangle formed of the sealing resin. In addition, half the semiconductor devices are arranged in mirror symmetry.

Also in the semiconductor device in FIG. 11, the first support member, second support member and third support member are located inside the not-shown first solder 51, second solder 52 and third solder 53, respectively, the same as those explained in Embodiment 1 and Embodiment 2, so they are designed in a reduced size.

Semiconductor devices 1 are arranged concentrically, which constitute the inverter 102.

Here, the positive terminals of the semiconductor devices 1 are electrically connected to a positive-voltage supply part 81 arranged along the inner circumference. The positive-voltage supply part 81 is connected to the positive electrode of a battery by not-shown wiring.

The negative terminals of the semiconductor devices 1 are electrically connected to a negative-voltage supply part 82 arranged along the outer circumference. The negative-voltage supply part 82 is connected to the negative electrode of the battery by not-shown wiring.

This electrical connection may be made by welding, soldering or the like. In addition, a power output terminal 83 for each phase connected to a coil of the rotating machine by not-shown wiring.

By configuring as described above, the semiconductor devices 1, positive-voltage supply part 81 and negative-voltage supply part 82 are arranged nearly in the same plane, thereby enabling the inverter 102 to be thinned. In addition, by configuring a rotating machine incorporating the inverter according to Embodiment 4, the inverter-integrated rotating machine can be thinned.

Incidentally, the number of semiconductor devices is made six (six phases) in FIG. 11; however the number is not limited to this.

Moreover, the shape of the positive-voltage supply part 81 is not limited to a hexagon but may be a polygon or circle. Furthermore, the positive-voltage supply part 81 is arranged along the inner circumferential side in FIG. 11; however the negative-voltage supply part 82 may be arranged along the inner circumferential side instead. In this case the semiconductor devices 1 may be arranged in such a way that the negative terminals of the semiconductor devices face inwardly.

FIG. 12 shows the electric circuit diagram of the rotating machine 100 incorporating the inverter 102 shown in FIG. 11. The rotating machine 100 in FIG. 12 includes a control means 101, the inverter 102, stationary coils 103 and 104 and a moving coil 105.

Each phase of the stationary coils 103 and 104 is connected to the battery 120 via the upper arm 111 and lower arm 112 including MOS-FET elements, and the control means 101 transmits a gate signal to those MOS-FET elements, whereby each MOS-FET element is controlled tuning on and off, so that current flowing through each phase of the stationary coils 103 and 104 is switched over. This rotating machine 100 can generate power from rotation of the moving coil 105 as well as drive the moving coil 105 to rotate depending on the signal from the control means 101.

As described above, according to Embodiment 4 of the invention, positive-voltage connecting terminals, negative-voltage connecting terminals and voltage output terminals are arranged in the same plane on which the semiconductor devices are arranged opposite to each other, whereby the positive-voltage connecting terminals and negative-voltage connecting terminals can be arranged nearly in the same plane even when the inverter is configured with the semiconductor devices arranged concentrically, so that the rotating machine incorporating the inverter can be thinned.

Furthermore, half the semiconductor devices are arranged in mirror symmetry in configuring the foregoing inverter, whereby the connection length along the outer circumference can be shortened, so that electric resistance can be reduced as well as wiring can be simplified.

INDUSTRIAL APPLICABILITY

The present invention is suited to configuring a power inverter using resin-sealed semiconductor devices that use MOS-FET elements.

DESCRIPTION OF THE REFERENCE NUMERALS

- 1-3: semiconductor device(s)
- 11: first lead
- 12: second lead
- 13, 14: gate lead
- 15: third lead
- 21, 26: MOS-FET element
- 22: top electrode
- 23: bottom electrode
- 24, 29: gate electrode
- 25, 30: protective coating
- 31, 36: internal lead
- 32: first joint plane
- 33: second joint plane
- 34: through hole
- 35: through hole
- 41: sealing resin
- 51-53: solder
- 54-57: support member
- 61, 63: projection
- 62: projection joint plane
- 71, 72: aluminum wire
- 81: positive-voltage supply part
- 82: negative-voltage supply part
- 83: power output terminal
- 100: rotating machine
- 101: control means
- 102: inverter
- 103, 104: stationary coil
- 105: moving coil
- 111: upper arm
- 112: lower arm
- 120: battery

The invention claimed is:

1. A semiconductor device including:
   a first lead;
   a second lead including a projection which is formed on a non-edge region of the second lead;
   a MOS-FET whose bottom electrode is electrically connected to the first lead;
   an internal lead that conducts current between a top electrode of the MOS-FET and the second lead;
   solder for electrically connecting those parts with each other; and
   sealing resin for determining relative positions of the parts; wherein:
   bottom surfaces of the first lead and the second lead are in the same plane, joint surfaces between the internal lead and the MOS-FET and between the internal lead and the second lead are also in the same plane, the first lead is joined with the bottom electrode of the MOS-FET with first solder, the top electrode of the MOS-FET is joined with the internal lead with second solder, the internal lead is joined with the projection of the second lead with third solder, and the first lead, the second lead, the MOS-FET and the internal lead are integrally molded using the sealing resin;
   the semiconductor device comprising support members each located inside at least the first solder and the second solder;
   a contact portion of the internal lead is disposed on the projection of the second lead which is protruded in a direction toward the internal lead; and
   a non-contact portion of the internal lead is protruded in a direction away front the second lead and is not aligned with the projection of the second lead.

2. A semiconductor device according to claim 1, wherein a first joint plane marked off by bending is provided on a first end of the internal lead, the projection is formed from the second lead by dowel-forming, and in addition, the first joint plane and a top surface of the projection are shaped substantially the same.

3. A semiconductor device according to claim 1, wherein the support members are spherical metal particles.

4. A semiconductor device according to claim 1, wherein the third solder includes a support member located therein-side.

5. A semiconductor device according to claim 1, wherein the support member located inside the second solder is formed by ultrasonic-bonding of metal wire onto the top electrode of the MOS-FET.

6. A semiconductor device according to claim 1, wherein a through hole is made in a non-joint portion of the internal lead.

7. A semiconductor device according to claim 1, wherein using at least two sets of the MOS-FET and the internal lead, a first MOS-FET is mounted on the first lead, a bottom electrode of the first MOS-FET is electrically connected with the first lead, a top electrode of the first MOS-FET is electrically connected with the second lead via a first internal lead, a second MOS-FET is mounted on the second lead, a bottom electrode of the second MOS-FET is electrically connected with the second lead, a top electrode of the second MOS-FET is electrically connected with a third lead via a second internal lead, and those parts are integrally molded using the sealing resin.

8. A semiconductor device according to claim 1, a joint plane of the internal lead is substantially inscribed in an outline of an electrode opening formed on a joint portion of the top electrode of the MOS-FET.

9. A semiconductor device including,
   a first lead;
   a second lead provided with a projection by transforming part of the second lead;
   a MOS-FET whose bottom electrode is electrically connected to the first lead;
   an internal lead for conducting current between a top electrode of the MOS-FET and the second lead;
   solder for electrically connecting those parts with each other; and
   sealing resin for determining relative positions of the parts; wherein
   bottom surfaces of the first lead and the second lead are in the same plane, joint surfaces between the internal lead and the MOS-FET and between the internal lead and the second lead are also in the same plane, the first lead is joined with the bottom electrode of the MOS-FET with first solder, the top electrode of the MOS-FET is joined with the internal lead with second solder, the internal lead is joined with the projection of the second lead with third solder, and the first lead, the second lead, the MOS-FET and the internal lead are integrally molded using the sealing resin;

the semiconductor device comprising support members each located inside at least the first solder and the second solder, a second joint plane marked off by bending is provided on a second end of the internal lead, and the second joint plane is substantially inscribed in an outline of an electrode opening formed on a joint portion of the top electrode of the MOS-FET.

10. A semiconductor device according to claim 9, wherein the outline of the electrode opening formed on the joint portion of the top electrode of the MOS-FET is circular-shaped.

11. A semiconductor device according to claim 9, wherein a through hole is made in the second joint plane of the internal lead.

12. A semiconductor device including,
a first lead;
a second lead provided with a projection by transforming part of the second lead;
a MOS-FET whose bottom electrode is electrically connected to the first lead;
an internal lead for conducting current between a top electrode of the MOS-FET and the second lead;
solder for electrically connecting those parts with each other; and
sealing resin for determining relative positions of the parts; wherein
bottom surfaces of the first lead and the second lead are in the same plane, joint surfaces between the internal lead and the MOS-FET and between the internal lead and the second lead are also in the same plane, the first lead is joined with the bottom electrode of the MOS-FET with first solder, the top electrode of the MOS-FET is joined with the internal lead with second solder, the internal lead is joined with the projection of the second lead with third solder, and the first lead, the second lead, the MOS-FET and the internal lead are integrally molded using the sealing resin, the semiconductor device comprising support members each located inside at least the first solder and the second solder, using at least two sets of the MOS-FET and the internal lead, a first MOS-FET is mounted on the first lead, a bottom electrode of the first MOS-FET is electrically connected with the first lead, a top electrode of the first MOS-FET is electrically connected with the second lead via a first internal lead, a second MOS-FET is mounted on the second lead, a bottom electrode of the second MOS-FET is electrically connected with the second lead, a top electrode of the second MOS-FET is electrically connected with a third lead via a second internal lead, and those parts are integrally molded using the sealing resin, the first lead and the third lead protrude outwardly from their respective opposing sides of the sealing resin.

13. A semiconductor device, wherein a plurality of semiconductor devices according to claim 12 are arranged concentrically in the same plane, and positive terminals of all of the semiconductor devices or negative terminals of all of the semiconductor devices are connected together by a power supply part arranged along an inner circumferential side in the same plane.

14. A semiconductor device according to claim 13, wherein half the semiconductor devices are arranged in mirror symmetry, and electrodes, in an outer circumferential side, of at least a set of adjacent semiconductor devices are connected together by a power supply part arranged in the same plane.

* * * * *